(12) United States Patent
Kim et al.

(10) Patent No.: US 10,312,473 B2
(45) Date of Patent: Jun. 4, 2019

(54) ORGANIC LIGHT EMITTING DISPLAY DEVICE

(71) Applicant: SAMSUNG DISPLAY CO., LTD., Yongin-si, Gyeonggi-do (KR)

(72) Inventors: Donghoon Kim, Suwon-si (KR); Dongchan Kim, Gunpo-si (KR); Wonjong Kim, Suwon-si (KR); Wonmin Yun, Suwon-si (KR); Byoungduk Lee, Seongnam-si (KR); Jihye Lee, Incheon (KR); Sanghoon Yim, Suwon-si (KR); Yoonhyeung Cho, Yongin-si (KR); Youngcheol Joo, Hwaseong-si (KR); Wonsuk Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/832,010

(22) Filed: Dec. 5, 2017

(65) Prior Publication Data

US 2018/0159083 A1  Jun. 7, 2018

(30) Foreign Application Priority Data

Dec. 6, 2016  (KR) .................. 10-2016-0165128

(51) Int. Cl.
*H01L 29/08* (2006.01)
*H01L 51/52* (2006.01)
*H01L 27/32* (2006.01)

(52) U.S. Cl.
CPC ...... *H01L 51/5275* (2013.01); *H01L 27/3244* (2013.01); *H01L 27/3272* (2013.01); *H01L 51/5253* (2013.01); *H01L 51/5256* (2013.01)

(58) Field of Classification Search
CPC .................................................. H01L 51/5275
USPC ........................................................ 257/40
See application file for complete search history.

(56) References Cited

U.S. PATENT DOCUMENTS

| 5,229,627 | A | 7/1993 | Kosaka |
| 2003/0203210 | A1 | 10/2003 | Graff et al. |
| 2009/0243483 | A1* | 10/2009 | Yang .................. H01L 27/3246 313/506 |
| 2009/0244906 | A1 | 10/2009 | Kim |
| 2011/0279895 | A1* | 11/2011 | Koh ..................... B29C 55/026 359/487.02 |
| 2014/0327866 | A1* | 11/2014 | Kang ................ G02F 1/133345 349/138 |

(Continued)

FOREIGN PATENT DOCUMENTS

| KR | 1020090104450 A | 10/2009 |
| KR | 101596449 B1 | 2/2016 |
| KR | 1020160065553 A | 6/2016 |

*Primary Examiner* — Ajay Arora
(74) *Attorney, Agent, or Firm* — Cantor Colburn LLP

(57) ABSTRACT

An organic light emitting display device includes: a substrate; an organic light emitting element on the substrate; and a thin film encapsulation layer on the organic light emitting element. The thin film encapsulation layer includes a first thin film, a second thin film and a third thin film which are sequentially stacked therein, a refractive index of the second thin film is about 1.7 or greater, and a refractive index of the first thin film and a refractive index of the third thin film are greater than the refractive index of the second thin film by about 0.35 or greater.

18 Claims, 9 Drawing Sheets

(56) References Cited

U.S. PATENT DOCUMENTS

2016/0126302 A1\* 5/2016 Cheng ................. H01L 27/3272
  257/40
2016/0155975 A1  6/2016 Jin et al.
2017/0117421 A1\* 4/2017 Okihara ................. G02B 5/283

\* cited by examiner

| Three layers | | | Five layers | | | Seven layers | | |
|---|---|---|---|---|---|---|---|---|
| n(LOW) | n(High) | Δλ (nm) | n(LOW) | n(High) | Δλ (nm) | n(LOW) | n(High) | Δλ (nm) |
| 1.4 | 2.1 | 98.04 | 1.4 | 1.837 | 65.52 | 1.4 | 1.717 | 49.29 |
| 1.5 | 2.178 | 89.70 | 1.5 | 1.924 | 60.07 | 1.5 | 1.808 | 45.11 |
| 1.6 | 2.25 | 82.08 | 1.6 | 2.008 | 54.83 | 1.6 | 1.898 | 41.27 |
| 1.7 | 2.319 | 68.91 | 1.7 | 2.091 | 46.04 | 1.7 | 1.986 | 34.61 |
| 1.8 | 2.386 | 62.59 | 1.8 | 2.172 | 41.8 | 1.8 | 2.073 | 31.44 |
| 1.9 | 2.452 | 56.68 | 1.9 | 2.252 | 37.83 | 1.9 | 2.159 | 28.45 |
| 2.0 | 2.515 | 50.94 | 2.0 | 2.330 | 34.00 | 2.0 | 2.243 | 25.54 |
| 2.1 | 2.577 | 45.53 | 2.1 | 2.407 | 30.38 | 2.1 | 2.327 | 22.86 |
| 2.2 | 2.638 | 40.40 | 2.2 | 2.483 | 26.95 | 2.2 | 2.409 | 20.21 |
| 2.3 | 2.697 | 35.44 | 2.3 | 2.558 | 23.68 | 2.3 | 2.491 | 17.77 |

| High refraction | | Refractive index | | Center λ (nm) | Δ λ (nm) | Reflectance (%) | Layers |
|---|---|---|---|---|---|---|---|
| Refractive index | Thickness (nm) | Refractive index | Thickness (nm) | | | | |
| 2.3 | 85 | 1.7 | 115 | 780 | 150 | 38% | 3 |
| 2.5 | 78 | 1.7 | 115 | 780 | 190 | 56% | 3 |
| 2.7 | 72 | 1.7 | 115 | 780 | 228 | 67% | 3 |
| 2.7 | 72 | 1.9 | 103 | 780 | 174 | 59% | 3 |
| 2.7 | 72 | 2.1 | 93 | 780 | 124 | 50% | 3 |
| 2.7 | 72 | 2.3 | 85 | 780 | 80 | 40% | 3 |
| 2.1 | 93 | 1.7 | 115 | 780 | 105 | 42% | 5 |
| 2.7 | 72 | 2.5 | 78 | 780 | 38 | 40% | 5 |

ORGANIC LIGHT EMITTING DISPLAY DEVICE

This application claims priority to Korean Patent Application No. 10-2016-0165128, filed on Dec. 6, 2016, and all the benefits accruing therefrom under 35 U.S.C. § 119, the content of which in its entirety is herein incorporated by reference.

BACKGROUND

1. Field

Exemplary embodiments of the invention relate to an organic light emitting display device including a layer that reflects ultraviolet and near ultraviolet rays, and more particularly, to an organic light emitting display device including a thin film encapsulation layer, in which three or more layers including a low refractive index layer having a refractive index of about 1.7 or greater and a high refractive index layer having a refractive index of about 2.3 or greater are stacked.

2. Discussion of Related Art

Among various types of display device, an organic light emitting display device has been attracting attention as a next generation display device due to desired characteristics thereof, such as a high response speed, a wide viewing angle and a high contrast. The organic light emitting display device may be used as a display portion of a small device such as a mobile phone or a display portion of a large product such as a television.

Generally, an organic light emitting display device includes organic light emitting elements disposed on a substrate, and a thin film encapsulation layer covering the organic light emitting elements. Since such organic light emitting elements are typically vulnerable to moisture and oxygen, the thin film encapsulation layer is provided on the organic light emitting elements to prevent external moisture and oxygen from permeating into a panel, thereby protecting the organic light emitting element from the external oxygen and moisture.

SUMMARY

Exemplary embodiments of the invention relate to an organic light emitting display device including a thin film encapsulation layer which includes an ultraviolet ray reflective layer for protecting an organic light emitting layer from ultraviolet rays and near ultraviolet rays.

According to an exemplary embodiment, an organic light emitting display device includes: a substrate; an organic light emitting element on the substrate; and a thin film encapsulation layer on the organic light emitting element. In such an embodiment, the thin film encapsulation layer includes a first thin film, a second thin film and a third thin film which are sequentially stacked therein, a refractive index of the second thin film is about 1.7 or greater, and a refractive index of the first thin film and a refractive index of the third thin film are greater than the refractive index of the second thin film by at least about 0.35 or greater.

In an exemplary embodiment, the refractive index of the second thin film may be about 2.3 or less.

In an exemplary embodiment, the second thin film may include at least one of $Nd_2O_3$, $Gd_2O_3$, $Sm_2O_3$, $Sc_2O_3$, $Y_2O_3$, SiO, $TiO_2$, $ZrO_2+Y_2O_3$, $ZrO_2$ and $SnO_2$.

In an exemplary embodiment, each of the refractive index of the first thin film and the refractive index of the third thin film may be about 2.05 or greater.

In an exemplary embodiment, each of the first thin film and the third thin film may include at least one of $ZrO_2+TiO_2$, $Cr_2O_3$, ZnO, $Ta_2O_5$, $TiO_2+T_2O_5$, $Sb_2O_3$, ZnS, CuO, $Fe_2O_3$, and Si.

In an exemplary embodiment, each of the first thin film, the second thin film, and the third thin film may have a thickness of about 60 nanometers (nm) or less.

In an exemplary embodiment, a reflectance of the thin film encapsulation layer may be about 20% or more at a wavelength of about 410 nm.

In an exemplary embodiment, a reflectance of the thin film encapsulation layer may be about 5% or less at a wavelength in a range from about 500 nm to about 600 nm.

In an exemplary embodiment, the organic light emitting display device may further include a monomer layer between the thin film encapsulation layer and the organic light emitting element.

In an exemplary embodiment, the monomer layer may have a thickness of about 40000 angstroms or greater.

In an exemplary embodiment, the monomer layer may include at least one of: propargyl methacrylate ("PMA"), glycidyl methacrylate ("GMA"), pentafluorophenyl methacrylate ("PFM"), furfuryl methacrylate ("FMA"), hydroxyethyl methacrylate ("HEMA"), vinyl pyrrolidone ("VP"), dimethylaminomethyl styrene ("DMAMS"), cyclohexyl methacrylate ("CHMA"), perfluorodecyl acrylate ("PFA"), trivinyltrimethyl cyclotrisiloxane ("V3D3"), 4-aminostyrene ("AS"), N-isopropylacrylamine ("NIPAAm"), maleic anhydride-alt-styrene ("MA-alt-St"), methacrylic acid-co-ethyl acrylate ("MAA-co-EA"), ethyleneglycol dimethacrylate ("EGDMA"), divinylbenzene ("DVB"), and di(ethylene glycol)divinyl ether ("DEGDVE").

In an exemplary embodiment, at least one of the first thin film and the third thin film may include SiON.

In an exemplary embodiment, the second thin film may include SiNx.

In an exemplary embodiment, each of the first thin film, the second thin film and the third thin film may have a thickness of about 60 nm or less.

According to an exemplary embodiment, an organic light emitting display device includes: a substrate; an organic light emitting element on the substrate; and a thin film encapsulation layer on the organic light emitting element. In such an embodiment, the thin film encapsulation layer includes a first thin film, a second thin film and a third thin film which are sequentially stacked therein, a refractive index of the second thin film is about 1.7 or greater, a refractive index of the first thin film and a refractive index of the third thin film are greater than the refractive index of the second thin film, and a reflectance of the thin film encapsulation layer is about 30% or greater at a wavelength of about 780 nm.

In an exemplary embodiment, the second thin film may include at least one of $Nd_2O_3$, $Gd_2O_3$, $Sm_2O_3$, $Sc_2O_3$, $Y_2O_3$, SiO, TiO, $ZrO_2$ and $SnO_2$.

In an exemplary embodiment, each of the refractive index of the first thin film and the refractive index of the third thin film may be about 2.3 or greater.

In an exemplary embodiment, each of the first thin film and the third thin film may include at least one of $ZrO_2+TiO_2$, $Cr_2O_3$, ZnO, $Ta_2O_5$, $TiO_2+T_2O_5$, $Sb_2O_3$, ZnS, CuO, $Fe_2O_3$, and Si.

In an exemplary embodiment, at least one of the first thin film and the third thin film may include SiON, and the second thin film may include SiNx.

In an exemplary embodiment, each of the first thin film, the second thin film, and the third thin film may have a thickness of about 60 nm or less.

The foregoing is illustrative only and is not intended to be in any way limiting. In addition to the illustrative aspects, exemplary embodiments and features described above, further aspects, exemplary embodiments and features will become apparent by reference to the drawings and the following detailed description.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
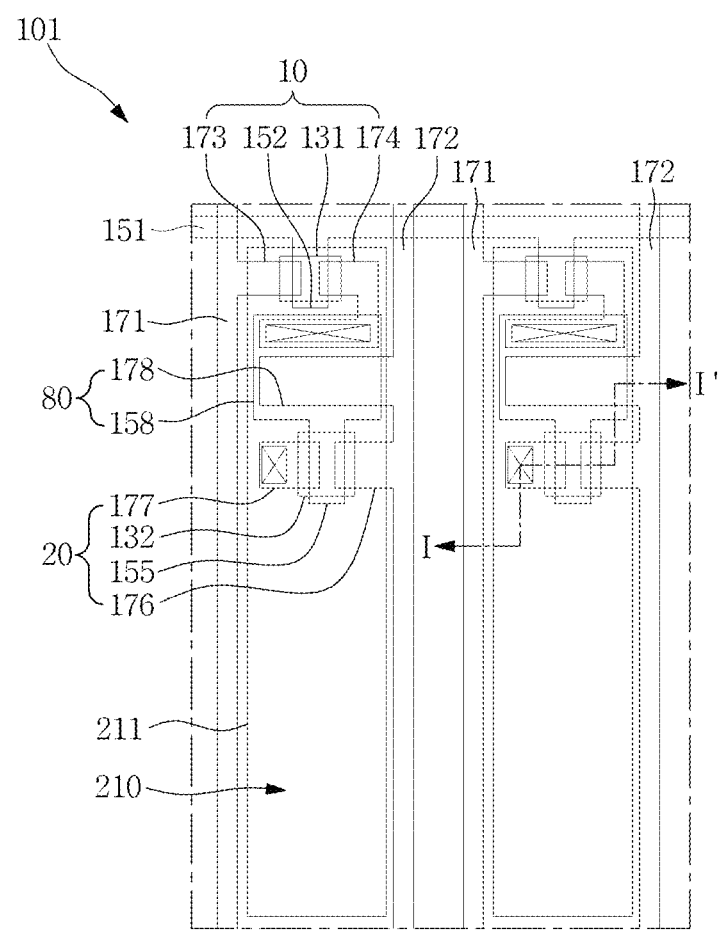
FIG. 1 is a plan view illustrating an organic light emitting display device according to an exemplary embodiment.

Exemplary embodiments will now be described more fully hereinafter with reference to the accompanying drawings. Although the invention may be modified in various manners and have several exemplary embodiments, exemplary embodiments are illustrated in the accompanying drawings and will be mainly described in the specification. However, the scope of the invention is not limited to the exemplary embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in herein.

Some of the parts which are not associated with the description may not be provided in order to specifically describe exemplary embodiments of the invention, and like reference numerals refer to like elements throughout the specification.

Hereinafter, an exemplary embodiment of the invention will be described with reference to FIGS. 1 and 2.

Figure 2:
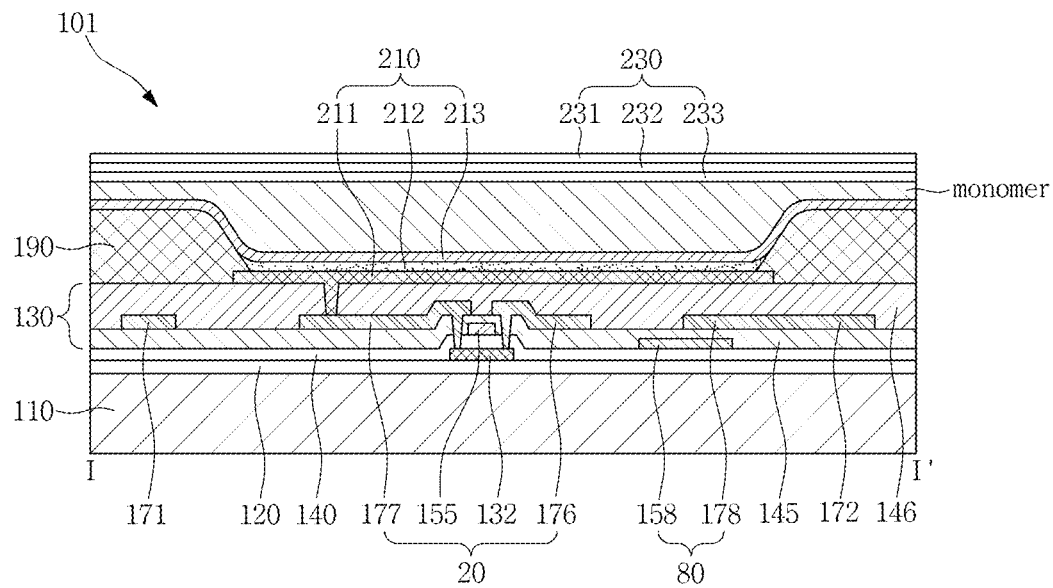
FIG. 2 is a cross-sectional view taken along line I-I' of FIG. 1.

FIG. 1 is a plan view illustrating an organic light emitting display device according to an exemplary embodiment, and FIG. 2 is a cross-sectional view taken along line I-I' of FIG. 1.

As illustrated in FIGS. 1 and 2, an exemplary embodiment of an organic light emitting display device 101 includes a substrate 110, a wiring portion 130, an organic light emitting element 210 and a thin film encapsulation layer 230.

The substrate 110 may include an insulating material selected from: glass, quartz, ceramic, plastic, or the like. However, exemplary embodiments are not limited thereto, and alternatively, the substrate 110 may include a metallic material such as stainless steel.

In an exemplary embodiment, as shown in FIG. 2, a buffer layer 120 is disposed on the substrate 110. The buffer layer 120 may include at least one of various inorganic layers and organic layers. The buffer layer 120 serves to substantially prevent permeation of undesirable elements, e.g., impurity elements or moisture, into the wiring portion 130 or the organic light emitting element 210, and to planarize a surface therebelow. In an alternative exemplary embodiment, the buffer layer 120 may be omitted.

The wiring portion 130 is disposed on the buffer layer 120. The wiring portion 130 includes a switching thin film transistor ("TFT") 10, a driving TFT 20 and a capacitor 80, and drives the organic light emitting element 210. The organic light emitting element 210 emits light based on a driving signal received from the wiring portion 130 to display an image.

FIGS. 1 and 2 illustrate an exemplary embodiment where the organic light emitting display device 101 is an active matrix-type organic light emitting diode ("AMOLED") display device having a two-transistor-one-capacitor ("2Tr-1Cap") structure. In such an embodiment, the 2Tr-1Cap structure may include two TFTs, e.g., the switching TFT 10 and the driving TFT 20, and a single capacitor 80 in each pixel, but exemplary embodiments are not limited thereto. In one alternative exemplary embodiment, for example, the organic light emitting display device 101 may include three or more TFTs and two or more capacitors in each pixel, and may further include additional wirings. Herein, the term "pixel" refers to a smallest unit for displaying an image, and the organic light emitting display device 101 displays an image using a plurality of pixels.

In an exemplary embodiment, each pixel PX includes the switching TFT 10, the driving TFT 20, the capacitor 80, and the organic light emitting element 210. In such an embodiment, a gate line 151 extending along one direction, and a data line 171 and a common power line 172 insulated from and intersecting the gate line 151 are disposed in the wiring portion 130. Each pixel PX may be defined by the gate line 151, the data line 171 and the common power line 172, which collectively define a boundary thereof, but exemplary embodiments are not limited thereto. In an alternative exemplary embodiment, the pixels PX may be defined by a pixel defining layer 190 or a black matrix.

The organic light emitting element 210 includes a first electrode 211, an organic light emitting layer 212 on the first electrode 211, and a second electrode 213 on the organic light emitting layer 212. Holes and electrons are injected into the organic light emitting layer 212 from the first electrode 211 and the second electrode 213, respectively. When the excitons formed by the injection of the injected holes and electrons fall from the excited state to the ground state, light emission occurs.

The capacitor 80 includes a pair of capacitor plates 158 and 178, with an insulating interlayer 145 interposed therebetween. In such an embodiment, the insulating interlayer 145 may be a dielectric element. A capacitance of the capacitor 80 is determined by electric charges accumulated in the capacitor 80 and a voltage or a potential difference between the pair of capacitor plates 158 and 178.

In an exemplary embodiment, as shown in FIG. 1, the switching TFT 10 includes a switching semiconductor layer 131, a switching gate electrode 152, a switching source electrode 173 and a switching drain electrode 174. In such an embodiment, the driving TFT 20 includes a driving semiconductor layer 132, a driving gate electrode 155, a driving source electrode 176 and a driving drain electrode 177. A gate insulation layer 140 is further provided to insulate the semiconductor layers 131 and 132 and the gate electrodes 152 and 155.

The switching TFT 10 may function as a switching element which selects a pixel to perform light emission. The switching gate electrode 152 is connected to the gate line 151, and the switching source electrode 173 is connected to the data line 171. In such an embodiment, the switching drain electrode 174 is spaced apart from the switching source electrode 173 and connected to one of the capacitor plates, e.g., the capacitor plate 158.

The driving TFT 20 applies a driving power, which allows an organic light emitting layer 212 of an organic light emitting element 210 in a selected pixel to emit light, to a first electrode 211. The driving gate electrode 155 is connected to the one capacitor plate 158 that is connected to the switching drain electrode 174. Each of the driving source electrode 176 and the other of the capacitor plates, e.g., the capacitor plate 178, is connected to the common power line 172. The driving drain electrode 177 is connected to the first electrode 211 of the organic light emitting element 210 through a contact hole defined in the planarization layer 146.

In an exemplary embodiment having the structure described above, the switching TFT 10 is driven based on a gate voltage applied to the gate line 151 and serves to transmit a data voltage applied to the data line 171 to the driving TFT 20. A voltage equivalent to a difference between a common voltage applied to the driving TFT 20 from the common power line 172 and the data voltage transmitted by (or from) the switching TFT 10 is stored in the capacitor 80, and a current corresponding to the voltage stored in the capacitor 80 flows to the organic light emitting element 210 through the driving TFT 20 such that the organic light emitting element 210 may emit light.

In an exemplary embodiment, the first electrode 211 maybe an anode for injecting holes, and the second electrode 213 maybe a cathode for injecting electrons. However, exemplary embodiments are not limited thereto, and alternatively, the first electrode 211 may be a cathode and the second electrode 213 may be an anode.

In an exemplary embodiment, a planarization layer 146 is disposed on the insulating interlayer 145. The planarization layer 146 may include an insulating material, and protect the wiring portion 130. The planarization layer 146 and the insulating interlayer 145 may include a substantially same material as each other.

The driving drain electrode 177 of the driving thin film transistor 20 is connected to the first electrode 211 of the organic light emitting element 210 through a contact hole defined in the planarization layer 146.

According to an exemplary embodiment, the first electrode 211 is a reflective electrode, and the second electrode 213 is a transflective electrode. Accordingly, in such an embodiment, a light generated in the organic light emitting layer 212 is emitted through the second electrode 213. In such an embodiment, the organic light emitting display device 101 have a top emission type structure.

In an exemplary embodiment, the reflective electrode or the transflective electrode may include a metal. In one exemplary embodiment, for example, the metal includes magnesium (Mg), silver (Ag), gold (Au), calcium (Ca), lithium (Li), chromium (Cr), aluminum (Al) and copper (Cu) or an alloy thereof.

In one exemplary embodiment, for example, the first electrode 211 may include a reflective layer including at least one of magnesium (Mg), silver (Ag), gold (Au), calcium (Ca), lithium (Li), chromium (Cr), aluminum (Al) and copper (Cu), and a transparent conductive layer disposed on the reflective layer. In an exemplary embodiment, the transparent conductive layer may include a transparent conductive oxide ("TCO"). In one exemplary embodiment, for example, the TCO may include at least one of indium tin oxide ("ITO"), indium zinc oxide ("IZO"), zinc oxide (ZnO), aluminum zinc oxide ("AZO") or indium oxide ($In_2O_3$). Since such a transparent conductive layer has a relatively high work function, hole injection through the first electrode 211 may become smooth.

In an exemplary embodiment, the first electrode 211 may have a triple-layer structure in which a transparent conductive layer, a reflective layer and a transparent conductive layer are sequentially stacked.

The second electrode 213 may include a transflective layer including at least one of magnesium (Mg), silver (Ag), gold (Au), calcium (Ca), lithium (Li), chromium (Cr), aluminum (Al) and copper (Cu). As a thickness of the transflective electrode decreases, the light transmittance increases. On the contrary, as the thickness of the transflective electrode increases, the light transmittance decreases.

The organic light emitting layer 212 may include a unimolecular organic material or a macromolecular organic material. The organic light emitting layer 212 may be formed by a known method using a known organic light emitting material.

In an exemplary embodiment, as shown in FIG. 2, an opening is defined in a pixel defining layer 190. The opening in the pixel defining layer 190 exposes a portion of the first electrode 211. The organic light emitting layer 212 and the second electrode 213 are sequentially stacked on a portion of the first electrode 211 that is exposed by the opening. The second electrode 213 is disposed not only on the organic light emitting layer 212 but also on the pixel defining layer 190. The pixel defining layer 190 may define a light emission area.

In an exemplary embodiment, the thin film encapsulation layer 230 is disposed on the organic light emitting element 210. The thin film encapsulation layer 230 effectively protects the organic light emitting element 210 and also serves to allow the light generated in the organic light emitting layer 212 to be efficiently emitted to an outside. In such an embodiment, the thin film encapsulation layer 230 also serves to block near ultraviolet rays from an outside.

The thin film encapsulation layer 230 may include a first refractive index layer 231 that defines an outermost layer thereof, a second refractive index layer 232, and a third refractive index layer 233.

In an exemplary embodiment, the thickness of the thin film encapsulation layer 230 is not particularly limited. The thin film encapsulation layer 230 may have a thickness enough to protect the organic light emitting element 210. When the thin film encapsulation layer 230 is thick, the organic light emitting element 210 may be more effectively protected. However, the thin film encapsulation layer 230 becomes thicker, the thickness of the organic light emitting display device 101 becomes greater. In an exemplary embodiment, the thin film encapsulation layer 230 may have a thickness in a range from about 30 nanometers (nm) to about 100 nm to effectively protect the organic light emitting element 210.

Figure 3A:
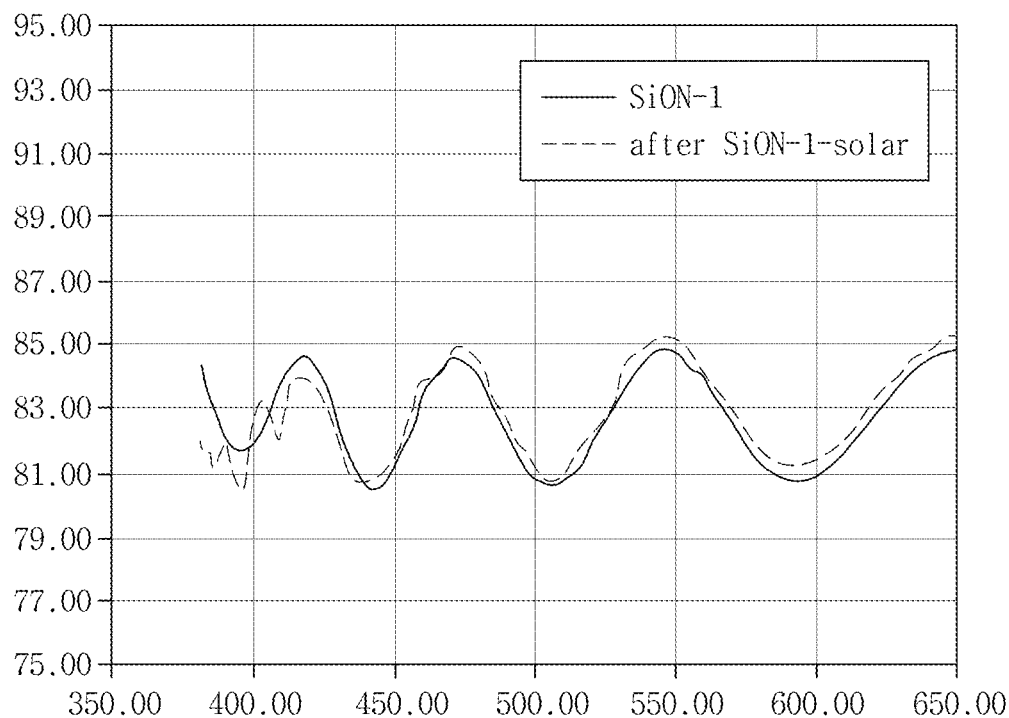
FIGS. 3A, 3B and 3C are graphs illustrating a transmittance change of a conventional thin film encapsulation layer due to ultraviolet light.
Figure 3B:
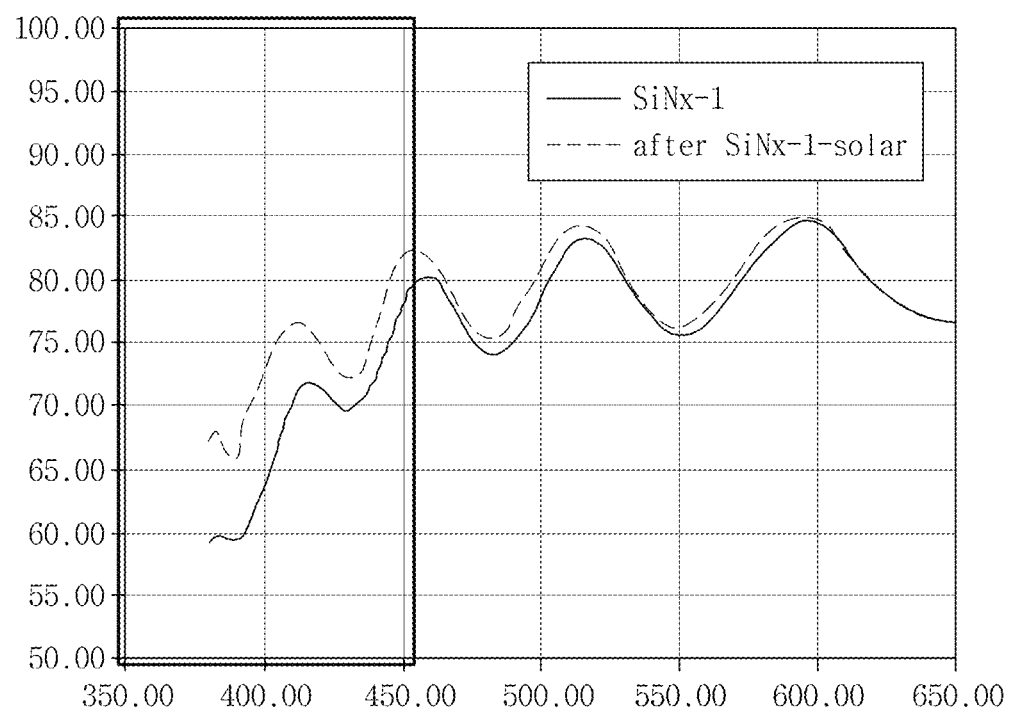
Figure 3C:
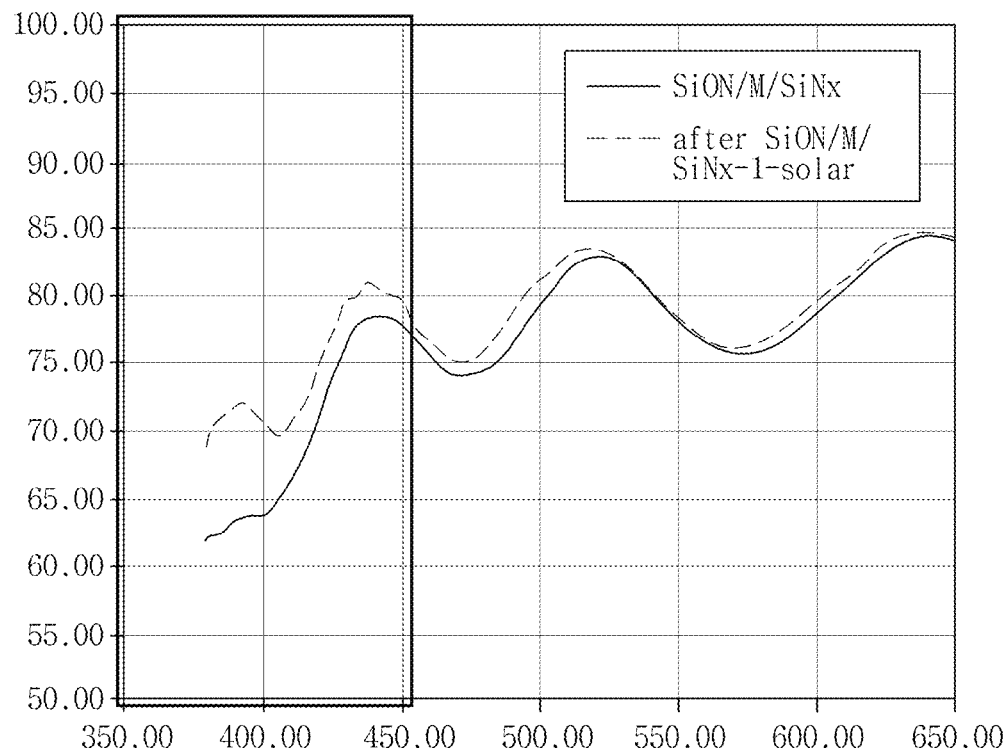

FIGS. 3A, 3B and 3C are graphs illustrating a transmittance change of a conventional thin film encapsulation layer due to ultraviolet light.

A thin film layer including SiON or SiNx is irradiated with solar rays for a predetermined period of time, and transmission characteristics of the thin film layer is measured for each wavelength. The solar ray irradiated to the thin film layer is output from a solar photon simulation apparatus (not illustrated). The solar photon simulation apparatus (not illustrated) is a device which implements a spectrum similar to the external solar light in a laboratory. A wavelength of an output light from the solar photon simulation apparatus may be in a range from about 250 nm to about 4000 nm, which is similar to the wavelength of the solar light. The measurement of the transmittance is performed mainly with respect to a wavelength range from about 380 nm to about 650 nm to include a range of ultraviolet light and visible light.

FIG. 3A is a graph illustrating a transmittance of a SiON thin film layer measured before and after the solar light is irradiated to the SiON thin film layer. The transmittance of the SiON thin film layer before solar light irradiation is indicated by a solid line, and the transmittance of the SiON thin film after solar light irradiation is indicated by a dotted line. Referring to FIG. 3A, the transmittance of the SiON thin film layer shows substantially no difference before and after being irradiated by the solar light. The SiON thin film layer is typically used for an encapsulation layer at a position close to the organic light emitting element 210.

FIG. 3B is a graph illustrating a transmittance of a SiNx thin film layer measured before and after the solar light is irradiated to the SiNx thin film layer. The transmittance of the SiNx thin film layer before solar light irradiation is indicated by a solid line, and the transmittance of the SiNx thin film after solar light irradiation is indicated by a dotted line as FIG. 3A Referring to FIG. 3B, the transmittance of the SiNx thin film layer increases in a wavelength range of about 450 nm or less after irradiation of solar light. In particular, at a wavelength of about 380 nm, the transmittance increases greatly from about 60% to about 70%. The SiNx thin film layer is typically used for an encapsulation layer at an outer area where a polarizing member is located.

FIG. 3C is a graph illustrating a transmittance of a thin film layer, in which three layers of SiON-Monomer ("M")-SiNx are stacked, before and after the solar light is irradiated thereto. The transmittance of the thin film layer including three layers of SiON-M-SiNx before solar light irradiation is indicated by a solid line, and the transmittance thereof after solar light irradiation is indicated by a dotted line. Referring to FIG. 3C, the transmittance of the thin film layer of three layers of SiON-M-SiNx increases in a wavelength range of about 450 nm or less after irradiation of solar light. In particular, at a wavelength of about 380 nm, the transmittance increases from about 60% to about 70%, which is similar to the transmittance characteristics of the SiNx thin film of FIG. 3B.

Referring to FIGS. 3A, 3B and 3C, the transmittance of the thin film encapsulation layer 230 including SiNx may increase in a near ultraviolet range when the organic light emitting display device 101 is used outdoor or exposed to solar light. When a light having a wavelength of about 450 nm or less, which corresponds to a near ultraviolet range, is incident to the organic light emitting element 210, an outgas may be generated from the pixel defining layer 190 of the organic light emitting element 210. The generated outgas may damage the organic light emitting layer 212, causes dark spots, and shorten the lifetime of the element.

Figure 4:
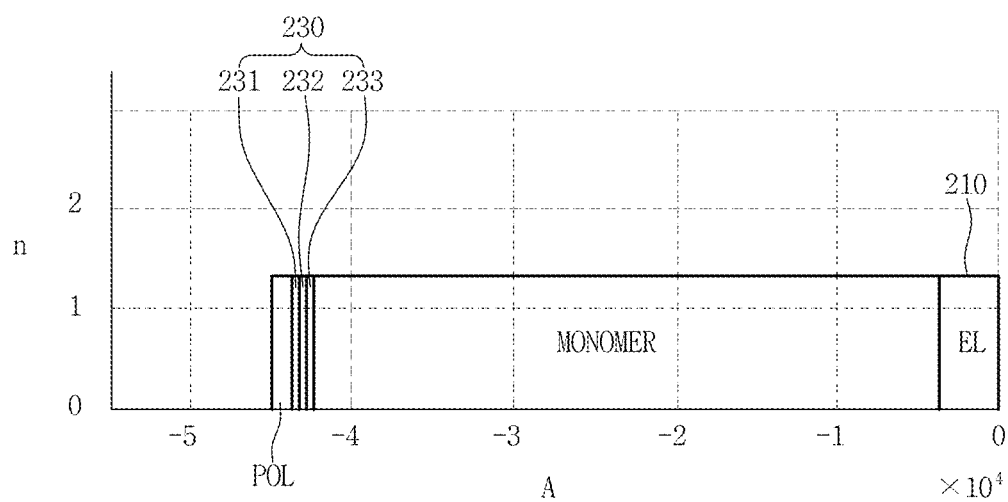
FIG. 4 is a layout diagram illustrating an ultraviolet light blocking thin film encapsulation layer according to an exemplary embodiment.

FIG. 4 is a layout diagram illustrating an ultraviolet light blocking thin film encapsulation layer according to an exemplary embodiment.

Referring to FIG. 4, the organic light emitting element 210 (EL in FIG. 4), a monomer, the thin film encapsulation layer 230, and a polarizing plate POL are located from the right side of the graph.

In an exemplary embodiment, the thin film encapsulation layer 230 has a stacking structure in which three or more thin films are stacked one on another, and the thin film encapsulation layer 230 reflects an incident light in a predetermined wavelength range. The wavelength range to be reflected is about 450 nm or less, which is a range of ultraviolet rays that affects the organic light emitting element 210. The thin film encapsulation layer 230 includes three or more layers defined by a thin film including a material having a high refractive index (hereinafter, "a high refractive index layer") and a thin film including a material having a low refractive index (hereinafter, "a low refractive index layer"), which are alternately stacked. The terms of the high refractive index layer and the low refractive index layer herein are not classified based on an absolute refractive index of the material, but are classified by a comparison of the relative refractive indices.

The thin film encapsulation layer 230 may include three or more layers including a high refractive index layer, a low refractive index layer and a high refractive index layer, and may have a thin film layer structure including five or seven stacked layers. An overall thickness of the thin film encapsulation layer 230 may be in a range from about 50 nm to about 500 nm. In such an embodiment, a thickness of each of the low refractive index layer and the high refractive index layer is about 60 nm or less. In an exemplary embodiment, where a thickness of each of the low refractive index layer and the high refractive index layer is more than about 60 nm, optical interference based on a difference between refractive indices may hardly occur, and the reflection effect may not occur.

The monomer disposed between the thin film encapsulation layer 230 and the organic light emitting element 210 is an organic layer capable of blocking transmission of external moisture and oxygen. In one exemplary embodiment, for example, the monomer may include at least one of propargyl methacrylate ("PMA"), glycidyl methacrylate ("GMA"), pentafluorophenyl methacrylate ("PFM"), furfuryl methacrylate ("FMA"), hydroxyethyl methacrylate ("HEMA"), vinyl pyrrolidone ("VP"), dimethylaminomethyl styrene ("DMAMS"), cyclohexyl methacrylate ("CHMA"), perfluorodecyl acrylate ("PFA"), trivinyltrimethyl cyclotrisiloxane ("V3D3"), 4-amino styrene ("AS"), N-isopropylacrylamine ("NIPAAm"), maleic anhydride-alt-styrene ("MA-alt-St"), methacrylic acid-co-ethyl acrylate ("MAA-co-EA"), ethyleneglycol dimethacrylate ("EGDMA"), divinylbenzene ("DVB"), and di(ethylene glycol)divinyl ether ("DEGDVE"), but the kind of the monomer is not limited thereto. The monomer may have a thickness of about 4000 nm or greater.

A reflectance Rf and a transmittance T of the thin film encapsulation layer 230 having a structure, in which a low refractive index layer and a high refractive index layer are disposed on a substrate, may be calculated by the following equation.

In the Equation below, ns denotes a refractive index of the substrate, nL denotes a refractive index of the low refractive index layer, nH denotes a refractive index of the high refractive index layer, λ denotes a central wavelength, and p denotes the number of a pair of the low/high refractive index layers in the thin film encapsulation layer 230.

$$R \approx 1 - 4\left(\frac{n_L}{n_H}\right)^{2p} \frac{n_S}{n_H^2}$$

$$T \approx 1 - R \approx 4\left(\frac{n_L}{n_H}\right)^{2p} \frac{n_S}{n_H^2}$$

In addition, a reflection wavelength range (Δλ) with respect to a center wavelength (λ) may be calculated by the following equation.

$$\Delta\lambda \approx \frac{4}{\pi}\lambda_0 \cdot \arcsin\left(\frac{n_H - n_L}{n_H + n_L}\right)$$

Accordingly, refractive index of each layer of the thin film encapsulation layer 230 that reflects light in the ultraviolet wavelength range may set based on the reflectance in a wavelength range of about 380 nm.

Based on the above equation, the substrate may have the refractive index ns of about 1.5, the low refractive index layer on the substrate may have the refractive index nL of about 1.7 and the thickness of about 40.97 nm, and the high refractive index layer on the low refractive index layer may have the refractive index nH of about 2.32 and the thickness of about 55.88 nm, The thin film layer including the low refractive index layer and the high refractive index layer has a reflectance Rf of about 40.04%, and a reflection wavelength range of about 74.82 nm.

Figures 5, 6A:
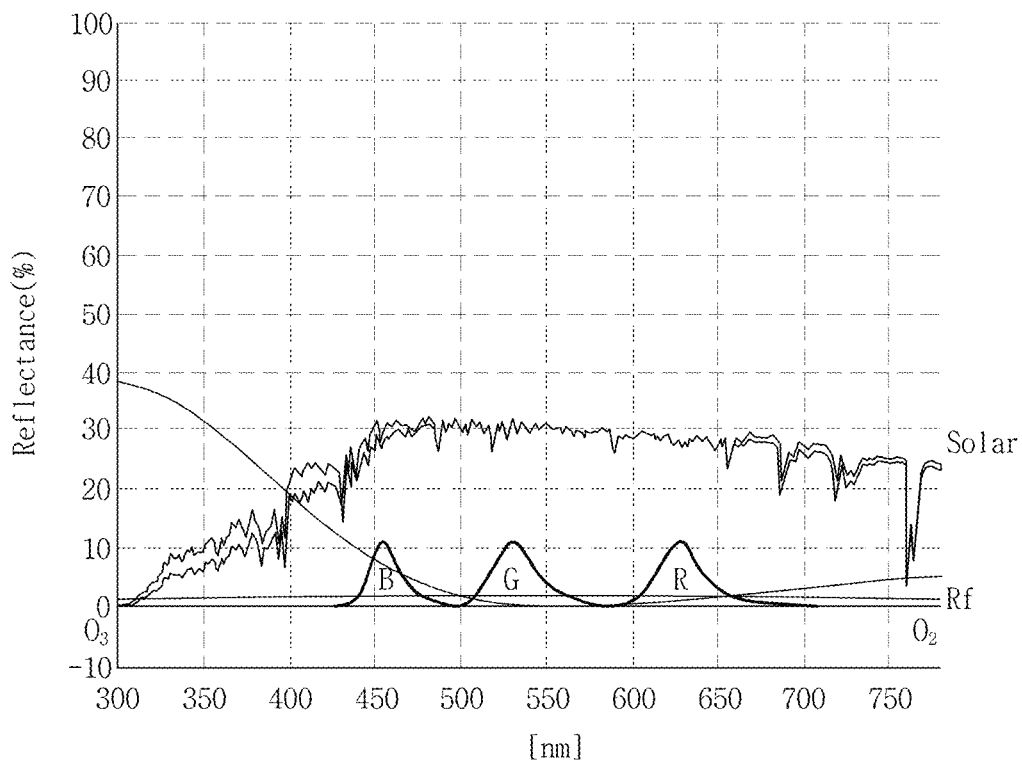
FIG. 5 is a table showing a refractive index and the number of stacked thin films.
FIGS. 6A, 6B and 6C are graphs illustrating a reflectance of a thin film encapsulation layer according to an exemplary embodiment.

FIG. 5 is a table showing a refractive index and the number of stacked thin films.

FIG. 5 shows a result of a reflection wavelength range Δλ based on a refractive index of a lower refractive index layer and a refractive index of a high refractive index layer, when the thin film encapsulation layer 230 is configured in a way such that a center wavelength λ is about 380 nm and a reflectance Rf is about 40%.

The wavelength range, in which reflection of the incident light occurs, may be calculated by adding or subtracting a half value of the reflection wavelength range Δλ to the center wavelength of the reflection wavelength. When the center wavelength is about 380 nm, for example, the reflection wavelength range Δλ is about 40 nm, and the reflection wavelength corresponds to a range from about 360 nm, which is obtained by subtracting 20 nm from 380 nm, to about 400 nm, which is obtained by adding 20 nm to 380 nm.

The reflection range of the thin film encapsulation layer 230 includes a range of about 400 nm or less, which corresponds to ultraviolet and near ultraviolet rays harmful to the organic light emitting element 210. On the other hand, it is more desired as the reflectance Rf of the wavelength range corresponding to the visible ray range decreases. In the case where the central wavelength λ of the reflection wavelength is about 380 nm, refractive indices of the low refractive index layer and the high refractive index layer may be selected to satisfy the above condition such that the reflection wavelength range Δλ is less than about 70 nm.

The triple-layered thin film encapsulation layer of FIG. 5 has a structure in which a high refractive index layer, a low refractive index layer and a high refractive index layer are sequentially stacked. A penta-layered thin film encapsulation layer has a structure in which a high refractive index layer, a low refractive index layer, a high refractive index layer, a low refractive index layer and a high refractive index layer are sequentially stacked, and a hepta-layered thin film encapsulation layer has a structure in which a high refractive index layer, a low refractive index layer, a high refractive index layer, a low refractive index layer, a high refractive index layer, a low refractive index layer and a high refractive index layer are sequentially stacked.

Referring to FIG. 5, in the case where the thin film encapsulation layer has a triple-layered structure, when the refractive index of the low refractive index layer is in a range from about 1.4 to about 1.6, the reflection wavelength range Δλ is in a range from about 98.04 nm to about 82.08 nm. As shown in FIG. 5, in the case where the refractive index of the low refractive index layer is in a range from about 1.7 to about 2.3, the reflection wavelength range Δλ is in a range from about 68.91 nm to about 35.44 nm. When the thin film encapsulation layer is formed to have a triple-layered thin film structure, the process becomes simple and the thin film encapsulation layer may be manufactured at a low cost.

As shown in FIG. 5, when the refractive index of the low refractive index layer of the thin film encapsulation layer is about 1.6 or less, the reflection wavelength range Δλ exceeds about 82.08 nm. Since the center wavelength λ is about 380 nm, a maximum wavelength at which reflection occurs is about 421 nm which is obtained by adding 41 nm, ½ of the reflection wavelength range Δλ, to 380 nm. 421 nm belongs to a wavelength range corresponding to blue light. That is, when the refractive index of the low refractive index layer of the thin film encapsulation layer is about 1.6 or less, blue light of the incident light may be reflected. In such a case, color expression capability of the organic light emitting display device may be degraded since the incident light in a visible ray range including the blue light is reflected.

As shown in FIG. 5, when the refractive index of the low refractive index layer of the triple-layered thin film encapsulation layer is about 1.7 and the refractive index of the high refractive index layer is about 2.3 or greater, the reflection wavelength range Δλ is about 68.91 nm. In such an exemplary embodiment, a maximum wavelength at which the reflection occurs is about 414 nm, which is obtained by adding 34 nm, ½ of the reflection wavelength range Δλ, to 380 nm. 414 nm belongs to a near ultraviolet range of about 415 nm or less, and the color expression capability of the organic light emitting display device may not be degraded.

In the case where the thin film encapsulation layer has a penta-layered thin film structure, when the refractive index of the low refractive index layer is in a range from about 1.4 to about 1.6, the reflection wavelength range Δλ is in a range from about 65.52 nm to about 54.83 nm. As shown in FIG. 5, when the refractive index of the low refractive index layer is in a range from about 1.7 to about 2.3, the reflection wavelength range Δλ is in a range from about 46.04 nm to about 23.68 nm.

In the case where the thin film encapsulation layer has a hepta-layered thin film structure, when the refractive index of the low refractive index layer is in a range from about 1.4 to about 1.6, the reflection wavelength range Δλ is in a range from about 49.29 nm to about 41.27 nm. As shown in FIG. 5, when the refractive index of the low refractive index layer is in a range from about 1.7 to about 2.3, the reflection wavelength range Δλ is in a range from about 34.61 nm to about 17.77 nm.

Referring to FIG. 5, it is most desired that the thin film encapsulation layer be formed into a triple-layered thin film structure, the refractive index of the low refractive index layer be about 1.7 or greater and the refraction index of the high refractive index layer be about 2.3 or greater. When the refractive index of the low refractive index layer is about 1.7 or greater, the thin film encapsulation layer may reflect ultraviolet rays and near ultraviolet rays with a minimum number of layers.

In addition, the stacked thin films may have five, seven, or more layers, such that the wavelength range to be reflected may be narrowed. Accordingly, reflection may be effectively prevented from occurring in the visible ray range while increasing the reflectance in the ultraviolet range.

Figure 6B:
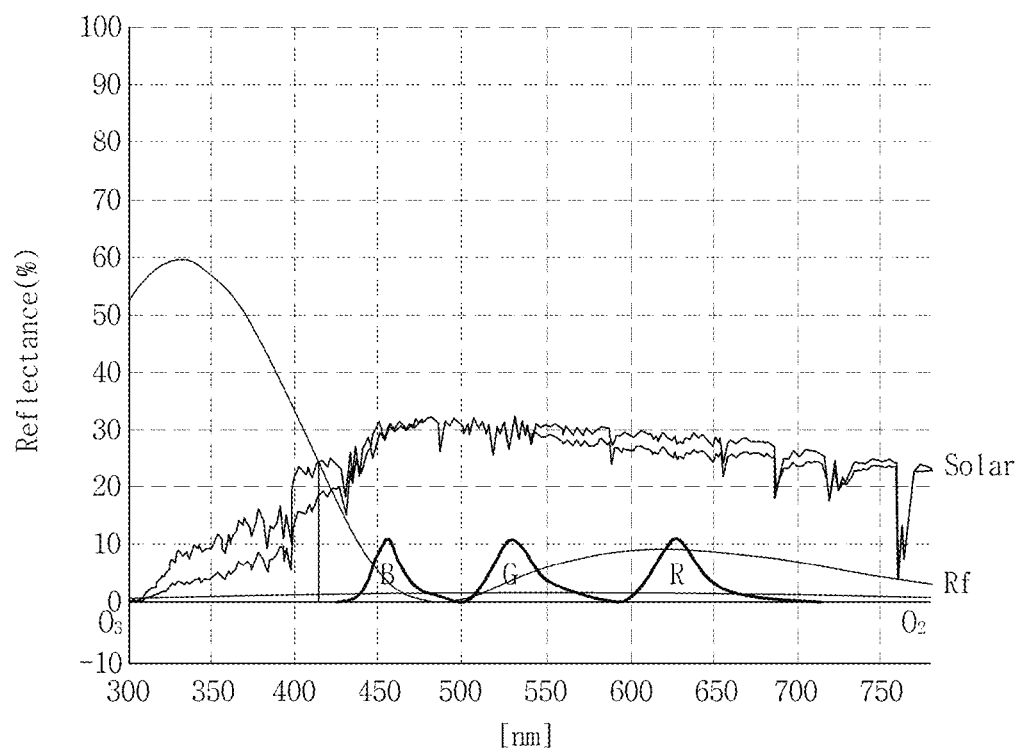
Figures 6C, 7:
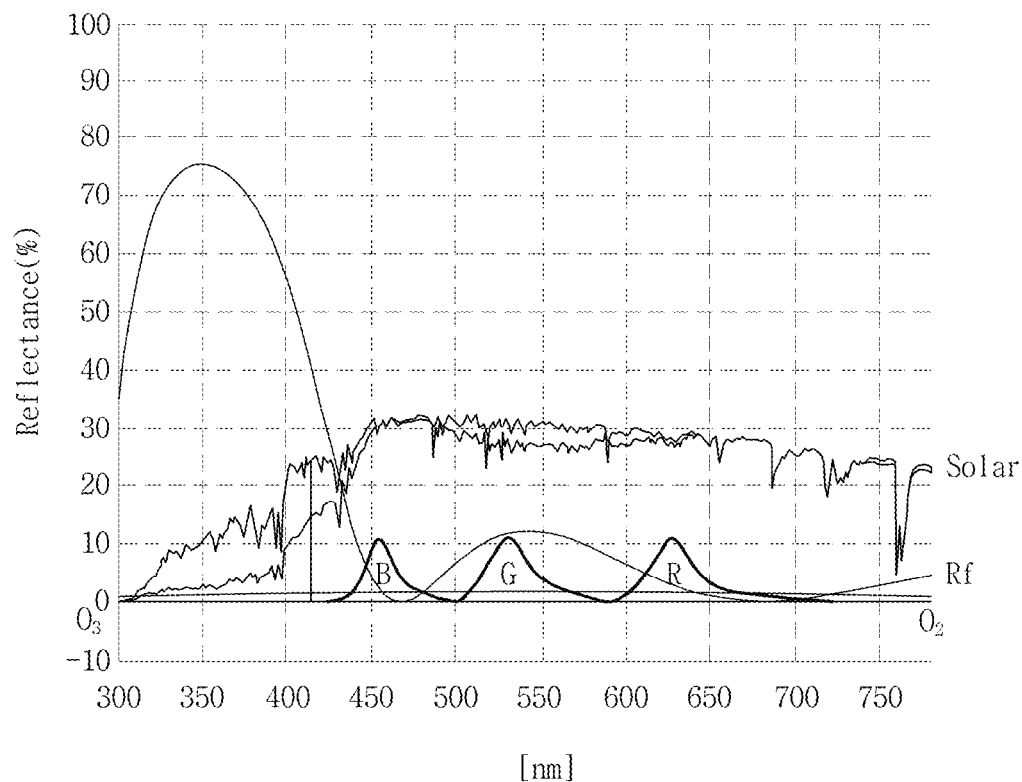
FIG. 7 is a table showing a refractive index of a thin film according to an alternative exemplary embodiment.

FIGS. 6A, 6B and 6C are graphs illustrating a reflectance of a multilayered thin film encapsulation layer and an output light wavelength of an organic light emitting element according to an exemplary embodiment.

FIG. 6A shows a reflectance (Rf) of an exemplary embodiment of a three-layered thin film encapsulation layer, an incidence light for each wavelength, an output wavelength of an organic light emitting element. The triple-layered thin film encapsulation layer is arranged in the order of a high refractive index layer, a low refractive index layer and a high refractive index layer. In such an embodiment, a refractive index $n_H$ of the high refractive index layer is about 2.3, and a refractive index $n_L$ of the low refractive index layer is about 1.7.

Referring to FIG. 6A, a reflectance of the triple-layered thin film encapsulation layer is about 40% at a wavelength of about 300 nm and has a highest reflectance at a wavelength range from about 300 nm to about 400 nm. The reflectance Rf of the thin film encapsulation layer tends to decrease as the wavelength range increases. The measurement result shows that an energy of about 4.81 millijoule per second and per square meter ($mJ/(sec \cdot m^2)$) is transmitted at about 415 nm, which corresponds to a wavelength range of blue B light. When reflection of the thin film encapsulation layer occurs in the visible ray wavelength range, the color expression capability of the organic light emitting display device 101 may be degraded in the presence of external light.

FIG. 6B shows a reflectance (Rf) of an exemplary embodiment of a penta-layered thin film encapsulation layer, an incidence light for each wavelength, an output wavelength of an organic light emitting element. The penta-layered thin film encapsulation layer is arranged in the order of a high refractive index layer, a low refractive index layer, a high refractive index layer, a low refractive index layer and a high refractive index layer. In such an embodiment, a refractive index $n_H$ of the high refractive index layer is about 2.3, and a refractive index $n_L$ of the low refractive index layer is about 1.7.

Referring to FIG. 6B, a reflectance of the penta-layered thin film encapsulation layer is about 60% at maximum at a wavelength of about 330 nm. The measurement result shows that an energy of about 3.59 $mJ/(sec \cdot m^2)$ is transmitted at about 415 nm, which corresponds to the wavelength range of blue B light. The penta-layered thin film encapsulation layer has a high reflectance in a range from about 600 nm to about 700 nm. The light range from about 600 nm to about 700 nm corresponds to the wavelength range of red R light, and a screen of the organic light emitting display device 101 appears reddish due to the wavelength of the reflected light.

FIG. 6C shows a reflectance of an exemplary embodiment of a hepta-layered thin film encapsulation layer, an incidence light for each wavelength, an output wavelength of an organic light emitting element. The hepta-layered thin film encapsulation layer is arranged in the order of a high refractive index layer, a low refractive index layer, a high refractive index layer, a low refractive index layer, a high refractive index layer, a low refractive index layer and a high refractive index layer. In such an embodiment, a refractive index $n_H$ of the high refractive index layer is about 2.3, and a refractive index $n_L$ of the low refractive index layer is about 1.7.

Referring to FIG. 6C, a reflectance of the hepta-layered thin film encapsulation layer is about 75% at maximum at a wavelength of about 350 nm. The measurement result shows that an energy of about 2.35 mJ/(sec·m$^2$) is transmitted at about 415 nm, which corresponds to the wavelength range of blue B light. The hepta-layered thin film encapsulation layer has a high reflectance in a range from about 500 nm to about 600 nm. The light range from about 500 nm to about 600 nm corresponds to the wavelength range of green G light, and a screen of the organic light emitting display device 101 appears greenish due to the wavelength of the reflected light.

Referring to FIGS. 6A, 6B and 6C, an exemplary embodiment of the thin film encapsulation layer may reflect light of an undesired (e.g., harmful) wavelength in a range from about 300 nm to about 400 nm to protect the organic light emitting element 210.

Referring to FIGS. 5 and 6A, by setting the refractive index of the low refractive index layer at about 1.7 or greater, a thin film encapsulation layer structure including three layers of thin films may define a reflective layer against ultraviolet light and near ultraviolet light. In an exemplary embodiment, where a refractive index of a material of the stacked thin films is about 1.7 or greater, ultraviolet light may be efficiently reflected with only three layers of thin films The following table 1 shows examples of a material having a refractive index of about 1.7 or greater, which may be applied to the low refractive index layer of the multi-layered thin film encapsulation layer according to an exemplary embodiment. The refractive index was measured at a reference wavelength of about 550 nm. In addition to the materials shown in Table 1, materials having a refractive index of about 1.7 or greater may be used in the low refractive index layer of exemplary embodiments. In one exemplary embodiment, for example, SiON may be used for the low refractive index layer when the refractive index thereof is about 1.7 or greater.

TABLE 1

| Chemical Formula | Refractive index (@550 nm) |
|---|---|
| $Nd_2O_3$ | 1.79 |
| $Gd_2O_3$ | 1.8 |
| $Sm_2O_3$ | 1.8 |
| $Sc_2O_3$ | 1.86 |
| $Y_2O_3$ | 1.87 |
| SiO | 1.8-1.9 |
| $TiO_2$ | 1.9-2.3 |
| $ZrO_2 + Y2O3$ | 1.9 |
| $ZrO_2$ | 1.97-2.05 |
| $SnO_2$ | 2.0-2.1 |

The following Table 2 shows examples of a material applicable to the high refractive index layer of the thin film encapsulation layer according to an exemplary embodiment. The refractive index is a result that was measured with respect to a wavelength of about 550 nm. The high refractive index layer of the triple-layered thin film encapsulation layer according to an exemplary embodiment may include a material having a refractive index of about 2.3 or greater. However, in an exemplary embodiment, where five or more thin films are used to form the thin film encapsulation layer, the high refractive index layer may include a material having a refractive index of about 2.05 or greater. In addition to the materials shown in Table 2, a material having a refractive index of about 2.3 or greater may be used in the high refractive index layer of exemplary embodiments. In one exemplary embodiment, for example, SiNx may be used in high refractive index layers when the refractive index thereof is about 2.3 or greater.

TABLE 2

| Chemical Formula | Refractive index (@550 nm) |
|---|---|
| $ZrO_2 + TiO_2$ | 2.05-2.15 |
| $Cr_2O_3$ | 2.1 |
| ZnO | 2.1 |
| $Ta_2O_5$ | 2.16 |
| $TiO_2 + T_2O_5$ | 2.25-2.3 |
| $Sb_2O_3$ | 2.3 |
| ZnS | 2.35 |
| CuO | 2.6 |
| $Fe_2O_3$ | 2.72 |
| Si | 3.4 |

FIG. 7 is a table showing a refractive index of a multi-layered thin film structure according to an alternative exemplary embodiment.

An infrared light component of an external incident light introduced into the organic light emitting element 210 increases a temperature of the organic light emitting layer 212 to cause deterioration.

FIG. 7 shows conditions of a refractive index and a thickness of the thin film encapsulation layer 230 which may block infrared ray components. In an exemplary embodiment, the thin film encapsulation layer 230 includes triple-layered thin films of a high refractive index layer, a low refractive index layer and a high refractive index layer. In an exemplary embodiment, where the thin film encapsulation layer 230 includes five thin films, the thin films are stacked in the order of a high refractive index layer, a low refractive index layer, a high refractive index layer, a low refractive index layer, and a high refractive index layer.

A center wavelength $\lambda$ of a reflection range is set to be about 780 nm which corresponds to an infrared wavelength range, and a reflectance is set to about 40%.

Referring to FIG. 7, in an exemplary embodiment of the thin film encapsulation layer 230 including three thin films, the low refractive index layer includes a material having a refractive index of about 1.7, a thickness of the thin film of the low refractive index layer is about 115 nm, the high refractive index layer includes a material having a refractive index of about 2.3, and a thickness of the thin film of the high refractive index layer is about 85 nm. The thin film encapsulation layer 230 having a triple-layered thin film structure has a reflectance (Rf) of about 38% and a reflection wavelength range $\Delta\lambda$ of about 150 nm.

In an exemplary embodiment where the thin film encapsulation layer 230 includes five thin films, the low refractive index layer includes a material having a refractive index of about 1.7, a thickness of the thin film of the low refractive index layer is about 115 nm, the high refractive index layer includes a material having a refractive index of about 2.1, and a thickness of the thin film of the high refractive index layer is about 93 nm. In such an exemplary embodiment, the thin film encapsulation layer 230 having a penta-layered thin film structure has a reflectance (Rf) of about 42% and a reflection wavelength range Δλ of about 105 nm.

The refractive index of the material of the thin film and the thickness of the thin film may be selected based on the number of stacked layers, the central wavelength λ, and the reflection wavelength range Δλ in the thin film encapsulation layer 230.

Figure 8A:
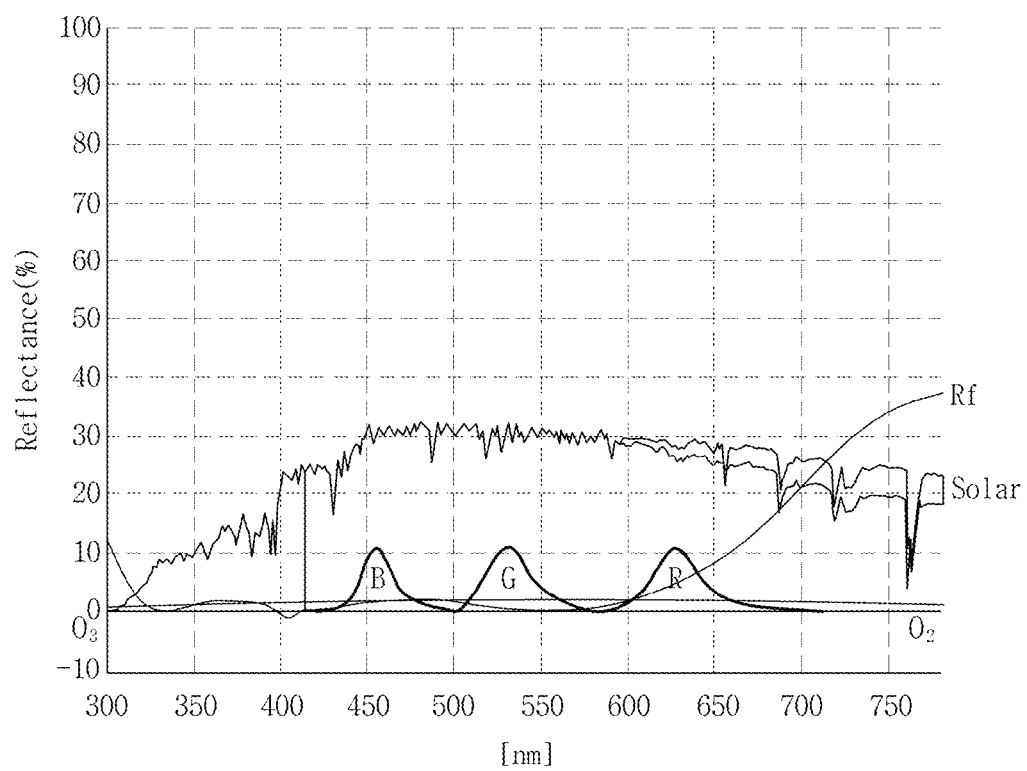
FIGS. 8A and 8B are graphs illustrating a reflectance of a thin film encapsulation layer according to an alternative exemplary embodiment.
Figure 8B:
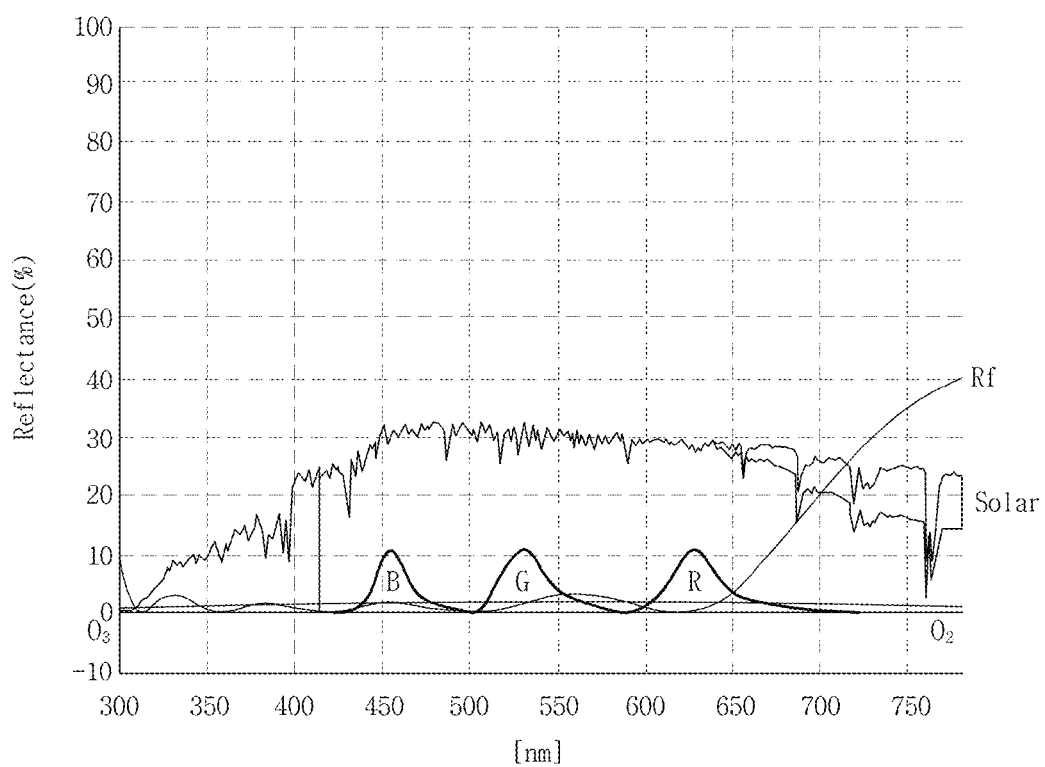

FIGS. 8A and 8B are graphs illustrating a reflectance of a thin film encapsulation layer according to an alternative exemplary embodiment.

FIG. 8A shows a reflectance (Rf) of an exemplary embodiment of a thin film encapsulation layer in which triple-layered thin films are stacked, an incidence light for each wavelength, and an output wavelength of the organic light emitting element. In such an embodiment of the thin film encapsulating layer, three thin film layers are arranged in the order of a high refractive index layer, a low refractive index layer and a high refractive index layer. In such an embodiment, a refractive index $n_H$ of the high refractive index layer is about 2.3 and a refractive index $n_L$ of the low refractive index layer is about 1.7.

In such an embodiment, as shown in FIG. 8A, the reflectance of the thin film encapsulation layer is about 38% at a wavelength of about 780 nm. The thin film encapsulation layer may effectively prevent a temperature of the organic light emitting layer from rising by reflecting an incident light having an infrared wavelength of about 700 nm or greater.

FIG. 8B shows a reflectance (Rf) of an exemplary embodiment of a thin film encapsulation layer in which five thin film layers are stacked, an incidence light for each wavelength, and an output wavelength of the organic light emitting element. In such an embodiment of the thin film encapsulating layer, five thin film layers are arranged in the order of a high refractive index layer, a low refractive index layer, a high refractive index layer, a low refractive index layer and a high refractive index layer. In such an embodiment, a refractive index $n_H$ of the high refractive index layer is about 2.1 and a refractive index $n_L$ of the low refractive index layer is about 1.7.

In such an embodiment, as shown in FIG. 8B, the reflectance of the thin film encapsulation layer is about 42% at a wavelength of about 780 nm. The thin film encapsulation layer may effectively prevent the organic light emitting layer from rising in a temperature and being deteriorated by reflecting an incident light having an infrared wavelength of about 700 nm or greater As set forth hereinabove, according to one or more exemplary embodiments, the stability of the organic light emitting display device may be improved by protecting an organic light emitting element from ultraviolet rays and near ultraviolet rays incident from the outside.

While the invention has been illustrated and described with reference to the exemplary embodiments thereof, it will be apparent to those of ordinary skill in the art that various changes in form and detail may be made thereto without departing from the spirit and scope of the invention.

What is claimed is:

1. An organic light emitting display device comprising:
    a substrate;
    an organic light emitting element on the substrate;
    a thin film encapsulation layer on the organic light emitting element; and
    wherein the thin film encapsulation layer comprises a first thin film, a second thin film and a third thin film, which are sequentially stacked therein,
    a refractive index of the second thin film is about 1.7 or greater,
    each of the refractive index of the first thin film and the refractive index of the third thin film is about 2.3 or greater, and
    a refractive index of the first thin film and a refractive index of the third thin film are greater than the refractive index of the second thin film by about 0.35 or greater.

2. The organic light emitting display device of claim 1, wherein the refractive index of the second thin film is about 2.3 or less.

3. The organic light emitting display device of claim 2, wherein the second thin film comprises at least one of $Nd_2O_3$, $Gd_2O_3$, $Sm_2O_3$, $Sc_2O_3$, $Y_2O_3$, SiO, $TiO_2$, $ZrO_2$+$Y_2O_3$, $ZrO_2$ and $SnO_2$.

4. The organic light emitting display device of claim 1, wherein each of the first thin film and the third thin film comprises at least one of $ZrO_2$+$TiO_2$, $Cr_2O_3$, ZnO, $Ta_2O_5$, $TiO_2$+$T_2O_5$, $Sb_2O_3$, ZnS, CuO, $Fe_2O_3$, and Si.

5. The organic light emitting display device of claim 1, wherein each of the first thin film, the second thin film, and the third thin film has a thickness of about 60 nm or less.

6. The organic light emitting display device of claim 1, wherein a reflectance of the thin film encapsulation layer is about 20% or greater at a wavelength of about 410 nm.

7. The organic light emitting display device of claim 6, wherein a reflectance of the thin film encapsulation layer is about 5% or less at a wavelength in a range from about 500 nm to about 600 nm.

8. The organic light emitting display device of claim 3, further comprising:
    a monomer layer between the thin film encapsulation layer and the organic light emitting element.

9. The organic light emitting display device of claim 8, wherein the monomer layer has a thickness of about 40000 angstroms or greater.

10. The organic light emitting display device of claim 9, wherein the monomer layer comprises at least one of propargyl methacrylate, glycidyl methacrylate, pentafluorophenyl methacrylate, furfuryl methacrylate, hydroxyethyl methacrylate, vinyl pyrrolidone, dimethylaminomethyl styrene, cyclohexyl methacrylate, perfluorodecyl acrylate, trivinyltrimethyl cyclotrisiloxane, 4-aminostyrene, N-isopropylacrylamine, maleic anhydride-alt-styrene, methacrylic acid-co-ethyl acrylate, ethyleneglycol dimethacrylate, divinylbenzene, and di(ethylene glycol)divinyl ether.

11. The organic light emitting display device of claim 1, wherein at least one of the first thin film and the third thin film comprises SiON.

12. The organic light emitting display device of claim 11, wherein the second thin film comprises SiNx.

13. The organic light emitting display device of claim 12, wherein each of the first thin film, the second thin film and the third thin film has a thickness of about 60 nm or less.

14. An organic light emitting display device comprising:
    a substrate;
    an organic light emitting element on the substrate;
    a thin film encapsulation layer on the organic light emitting element; and
    wherein the thin film encapsulation layer comprises a first thin film, a second thin film and a third thin film, which are sequentially stacked therein, a refractive index of the second thin film is about 1.7 or greater, a refractive index of the first thin film and a refractive index of the third thin film are greater than the refractive index of the second thin film, each of the refractive index of the first thin film and the refractive index of the third thin film is about 2.3 or greater, and a reflectance of the thin film encapsulation layer is about 30% or greater at a wavelength of about 780 nm.

15. The organic light emitting display device of claim 14, wherein the second thin film comprises at least one of $Nd_2O_3$, $Gd_2O_3$, $Sm_2O_3$, $Sc_2O_3$, $Y_2O_3$, SiO, TiO, $ZrO_2$ and $SnO_2$.

16. The organic light emitting display device of claim 14, wherein each of the first thin film and the third thin film comprises at least one of $ZrO_2+TiO_2$, $Cr_2O_3$, ZnO, $Ta_2O_5$, $TiO_2+T_2O_5$, $Sb_2O_3$, ZnS, CuO, $Fe_2O_3$, and Si.

17. The organic light emitting display device of claim 14, wherein at least one of the first thin film and the third thin film comprises SiON and the second thin film comprises SiNx.

18. The organic light emitting display device of claim 17, wherein each of the first thin film, the second thin film and the third thin film has a thickness of about 60 nm or less.

* * * * *